United States Patent
He et al.

(10) Patent No.: US 10,644,120 B2
(45) Date of Patent: May 5, 2020

(54) THIN FILM TRANSISTOR, GOA CIRCUIT, DISPLAY SUBSTRATE AND DISPLAY DEVICE

(71) Applicants: Boe Technology Group Co., Ltd., Beijing (CN); Hefei Xinsheng Optoelectronics Technology Co., Ltd., Anhui (CN)

(72) Inventors: Wei He, Beijing (CN); Xinjie Zhang, Beijing (CN); Wenlong Xiao, Beijing (CN); Siquan Wu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/735,938

(22) PCT Filed: Apr. 18, 2017

(86) PCT No.: PCT/CN2017/080842
§ 371 (c)(1),
(2) Date: Dec. 12, 2017

(87) PCT Pub. No.: WO2018/058939
PCT Pub. Date: Apr. 5, 2018

(65) Prior Publication Data
US 2019/0006477 A1    Jan. 3, 2019

(30) Foreign Application Priority Data
Sep. 28, 2016   (CN) .......................... 2016 1 0861627

(51) Int. Cl.
*H01L 27/12*    (2006.01)
*H01L 29/786*    (2006.01)
(Continued)

(52) U.S. Cl.
CPC .. *H01L 29/41733* (2013.01); *H01L 21/76894* (2013.01); *H01L 27/124* (2013.01);
(Continued)

(58) Field of Classification Search
CPC ............. H01L 29/66765; H01L 29/786; H01L 27/124; H01L 27/3276; G02F 1/1333; G02F 1/1343
See application file for complete search history.

(56) References Cited

U.S. PATENT DOCUMENTS

2010/0289025 A1* 11/2010 Nakagawa ............ H01L 27/124
257/59
2013/0009155 A1* 1/2013 Chang ............... H01L 29/41733
257/59

(Continued)

FOREIGN PATENT DOCUMENTS

| CN | 1959984 A | 5/2007 |
|---|---|---|
| CN | 101414083 A | 4/2009 |
| CN | 106206746 A | 12/2016 |

OTHER PUBLICATIONS

International Search Report received for PCT Patent Application No. PCT/CN2017/080842, dated Jul. 20, 2017, 6 pages (2 pages of English Translation and 4 pages of Original Document).

*Primary Examiner* — Phat X Cao
(74) *Attorney, Agent, or Firm* — Womble Bond Dickinson (US) LLP

(57) ABSTRACT

A thin film transistor is disclosed, comprising a first, second and third electrode. The first and second electrodes are arranged in a same layer and insulated from each other. The third electrode is arranged below and insulated from the first and second electrodes. The first electrode comprises at least one first conducting part. The second electrode comprises second conducting parts, each of which is arranged adjacent with each first conducting part. The third electrode is pro- (Continued)

vided with an opening part at least partially overlapping with the first or second conducting part. If the first or second conducting part is subject to a channel defect due to short circuit, the first or second conducting part is cut off at an overlapping position with the opening part, to repair the channel defect without affecting the third electrode. A GOA circuit, a display substrate and a display device are further disclosed.

16 Claims, 7 Drawing Sheets

(51) Int. Cl.
| | |
|---|---|
| *H01L 27/32* | (2006.01) |
| *H01L 29/66* | (2006.01) |
| *H01L 29/417* | (2006.01) |
| *H01L 29/423* | (2006.01) |
| *H01L 21/768* | (2006.01) |
| *G02F 1/1362* | (2006.01) |
| *G02F 1/1368* | (2006.01) |

(52) U.S. Cl.
CPC ...... *H01L 27/3244* (2013.01); *H01L 27/3276* (2013.01); *H01L 29/42384* (2013.01); *H01L 29/66765* (2013.01); *H01L 29/786* (2013.01); *H01L 29/78696* (2013.01); *G02F 1/1368* (2013.01); *G02F 1/136259* (2013.01); *G02F 2001/136268* (2013.01); *G02F 2201/506* (2013.01)

(56) References Cited

U.S. PATENT DOCUMENTS

2015/0129882 A1* 5/2015 Jiang ................ H01L 29/41733
257/72
2015/0236041 A1* 8/2015 Kim .................... H01L 27/1248
257/72

* cited by examiner

THIN FILM TRANSISTOR, GOA CIRCUIT, DISPLAY SUBSTRATE AND DISPLAY DEVICE

RELATED APPLICATIONS

The present application is the U.S. national phase entry of PCT/CN2017/080842, with an international filing date of Apr. 18, 2017, which claims the benefit of Chinese Patent Application No. 201610861627.5, filed on Sep. 28, 2016, the entire disclosures of which are incorporated herein by reference.

TECHNICAL FIELD

The present disclosure relates to the field of display technology, and particularly to a thin film transistor, a GOA circuit, a display substrate, and a display device.

BACKGROUND

Due to advantages of a small volume, a low power consumption, and radiation-free, a liquid crystal display device (LCD) has become a mainstream product of a flat display device. LCD generally comprises an array substrate and a color film substrate, which are assembled to form a liquid crystal display panel. The array substrate generally comprises thin film transistors and pixel electrodes which are arranged on a glass substrate. The array substrate is further provided with gate lines (i.e., scan lines), data lines and common electrode lines. The gate lines and data lines intersect to divide the array substrate into pixel regions, and each pixel region is provided with a pixel electrode. Gate lines for driving thin film transistors and data lines for delivering voltage signals to be loaded to pixels intersect with one another on the glass substrate.

Channel defects due to foreign materials or residuals form a key factor which affects the yield. Channel defects directly affect normal charging of pixels, thus affect the electrical property of the thin film transistor, and thus affect rotation of liquid crystal. If foreign materials or residuals appear in a large range of the display panel, the display effect of the whole display panel would degrade. The existing repair by cutting generally will damage electrode structure in the thin film transistors, which affects the electrical property of thin film transistors, and further affects display performance of the display panel and display device.

SUMMARY

An embodiment of the present disclosure provides a thin film transistor. The thin film transistor comprises a first electrode, a second electrode, and a third electrode. The first and second electrodes are arranged in a same layer and are insulated from each other. The third electrode is arranged below and insulated from the first and second electrodes. The first electrode comprises at least one first conducting part. The second electrode comprises a plurality of second conducting parts, and each of the second conducting parts is arranged adjacent with each of the first conducting parts. The third electrode is provided with an opening part, and the opening part at least partially overlaps with the first conducting part or the second conducting parts.

In the thin film transistor of this embodiment, the overlapping region between the opening part of the third electrode and the first or second conducting part forms a cutting area. At the cutting area, the electrode where a channel defect occurs can be repaired by cutting, e.g. by means of laser. For example, when the first conducting part of the first electrode or the second conducting parts of the second electrode is subject to a channel defect due to short circuit, the first or second conducting part is cut off in the overlapping region, thus eliminating the channel defect. Since the cutting area corresponds to the opening part of the third electrode, namely, the third electrode is absent in this area, the repair does not affect the third electrode of thin film transistor.

In an embodiment of the present disclosure, the opening part is arranged on an end region of the third electrode in an extending direction of the first conducting part or the second conducting parts.

In the thin film transistor of this embodiment, the opening part is arranged at the end region of the third electrode, and overlaps with the first or second conducting part at a region which is the end region of the third electrode. In case the first or second conducting part is subject to a channel defect due to short circuit, the corresponding first or second conducting part is cut off in the cutting area. This can increase the success rate for repairing the channel defect.

Moreover, in the thin film transistor of this embodiment, since the opening part is arranged in the end region of the third electrode, the first and second electrodes can arranged in a region other than the end region of the third electrode. This improves the space utilization efficiency of the third electrode, and facilitates increasing a width to length ratio of channel. In case a channel defect occurs, the first or second conducting part which is subject to short circuit is cut off to repair the channel defect, so that the width to length ratio of channel is reduced. By increasing the width to length ratio of channel, a good channel performance of thin film transistor may be maintained after repairing the channel defect, and thus a good electrical property is maintained. In case the width to length ratio of channel in the thin film transistor is increased, the requirements in a size display device for a fast charging rate and high aperture ratio can be met.

In an embodiment of the present disclosure, the opening part has a strip shape; and the opening part extends in a direction perpendicular with the extending direction of the first conducting part or the second conducting parts.

In the thin film transistor of this embodiment, the strip shaped opening part has an extending direction perpendicular with the first and second conducting part, and thus overlaps with the first or second conducting part to form a cutting area. This is favorable for repair by cutting when a channel defect occurs.

In an embodiment of the present disclosure, the opening part is rectangular or elliptic.

In the thin film transistor of this embodiment, the rectangular shaped opening part has a regular shape and is easy to fabricate. A size of the opening part in its extending direction (i.e., length) is enough to span all first conducting parts or all second conducting parts, while a size in a direction perpendicular with its extending direction (i.e., width) is only required to provide suitable space for laser or other cutting off manner. In principle, the width of opening part is as small as possible, which facilitates a relatively large width to length ratio for the channel. The opening part are not limited these shapes, but can be other shapes like a rectangle with rounded corners or other elongated shapes.

In an embodiment of the present disclosure, the first electrode comprises one first conducting part; the second electrode comprises two second conducting parts; and the opening part at least partially overlaps with each second conducting part of the second electrode.

In the thin film transistor of this embodiment, the thin film transistor adopts a single channel design. By cutting the second conducting part of the second electrode in which the channel defect occurs, the channel defect is eliminated, and the thin film transistor is repaired. In an embodiment of the present disclosure, the first electrode comprises N first conducting parts, N being an integer larger than 1; the second electrode comprises at least N second conducting parts; and the first conducting part and the second conducting parts are arranged alternately.

In the thin film transistor of this embodiment, the thin film transistor adopts at least dual-channel design. The first conducting part and second conducting part are arranged alternately. This facilitates increasing the width to length ratio of channel.

In an embodiment of the present disclosure, the first electrode comprises N first conducting parts, N being an integer larger than 1; the second electrode comprises 2N second conducting parts; and each of the first conducting parts is surrounded by two second conducting parts.

In the thin film transistor of this embodiment, the thin film transistor adopts at least dual-channel design. This facilitates increasing the width to length ratio of channel. Moreover, since the channels are independent from each other and do not share the second conducting part, in case a certain second conducting part is cut off due to channel defect, the neighboring channels are not affected.

In an embodiment of the present disclosure, the first conducting part and the second conducting parts have a linear shape.

In the thin film transistor of this embodiment, the first and second electrodes have a simple and compact structure. This facilitates forming a channel with a relatively large width to length ratio in the limited area of the third electrode.

In an embodiment of the present disclosure, the first conducting part and the second conducting parts have a non-linear shape; and the second conducting parts are arranged to surround the first conducting part.

In the thin film transistor of this embodiment, by adopting the first and second conducting part of a non-linear shape, this facilitates increasing the width to length ratio of channel.

In an embodiment of the present disclosure, the second electrode further comprises a second electrode line for electrically connecting the second conducting parts.

In the thin film transistor of this embodiment, the second electrode does not comprise the second connection part for electrically connecting the second conducting part to the second electrode line, so that the second electrode line of the second electrode can be arranged close to the third electrode and occupies less area of the pixel region, or can be arranged over the third electrode without occupying the area of the pixel region. In this way, the ITO pattern occupies a larger portion of the pixel region, and the aperture ratio increases.

In an embodiment of the present disclosure, the second electrode further comprises a second connection part for electrically connecting the second conducting parts to the second electrode line; and an orthographic projection of the second electrode line and the second connection part falls within an orthographic projection of the third electrode.

In the thin film transistor of this embodiment, an orthographic projection of the second electrode line and second connection part falls within an orthographic projection of the third electrode, and thus the second electrode line and second connection part do not occupy the pixel region, so that the ITO pattern occupies a larger portion of the pixel region, and the aperture ratio increases. The orthographic projection as used herein refers to a projection onto a plane in which the first conducting part and second conducting part lie.

In an embodiment of the present disclosure, an orthographic projection of the second electrode line falls within an orthographic projection of the third electrode.

In the thin film transistor of this embodiment, an orthographic projection of the second electrode line falls within an orthographic projection of the third electrode, and thus the second electrode line does not occupy the pixel region, so that the ITO pattern occupies a larger portion of the pixel region, and the aperture ratio increases. Moreover, since the second electrode does not comprise the second connection part, the opening part of the third electrode can be relatively small and the space utilization efficiency of the third electrode is increased. This facilitates increasing the width to length ratio of channel.

In an embodiment of the present disclosure, the first electrode further comprises a first electrode line for electrically connecting the first conducting part.

In the thin film transistor of this embodiment, since the first electrode does not comprise a connection part for electrically connecting the first conducting part to the first electrode line, the first electrode line of the first electrode can be arranged close to the gate electrode, and thus occupies a relatively small area of the pixel region. As a result, the ITO pattern occupies a larger portion of the pixel region, and the aperture ratio increases.

In an embodiment of the present disclosure, the first and second electrodes have a comb shape.

In the thin film transistor of this embodiment, the first electrode line and first conducting part have a comb shape, and the second electrode line and second conducting part have a comb shape. The first conducting part and second conducting part are arranged alternately, thus forming an interdigital electrode structure. This is an example for a multiple channel. The structure is compact and facilitates increasing the width to length ratio of channel.

In an embodiment of the present disclosure, the thin film transistor further comprises a semiconductor layer, which is arranged between the first and second electrodes and the third electrode; and an orthographic projection of the semiconductor layer coincides with an orthographic projection of the third electrode.

In the thin film transistor of this embodiment, the semiconductor layer form an active layer of the thin film transistor, and an orthographic projection of the semiconductor layer coincides with an orthographic projection of the third electrode. This facilitates simplifying process steps. Moreover, the orthographic projection of the semiconductor layer coincides with the orthographic projection of the third electrode. This indicates that the semiconductor layer is also absent in the opening part of the third electrode, so that the repair by cutting would not damage the active layer of the thin film transistor, and this facilitates improving yield and reducing cost.

In an embodiment of the present disclosure, the third electrode is gate electrode; and one of the first and second electrodes is a source electrode, and the other is a drain electrode.

In the thin film transistor of this embodiment, the first and second electrodes form the source or drain electrode of the thin film transistor, respectively, and the third electrode forms the gate electrode of the thin film transistor.

An embodiment of the present disclosure provides a GOA circuit, comprising the thin film transistor as described above.

The GOA circuit of this embodiment has same or similar beneficial effects with those of the thin film transistor as described in the above embodiments, which are not repeated here.

An embodiment of the present disclosure provides a display substrate, comprising the thin film transistor as described above. The first electrode is electrically connected to the pixel electrode of each pixel, the second electrode is connected to a data line, and the third electrode is a gate line.

The display substrate of this embodiment has same or similar beneficial effects with those of the thin film transistor as described in the above embodiments, which are not repeated here.

An embodiment of the present disclosure provides a display device, comprising the display substrate as described above.

The display device of this embodiment has same or similar beneficial effects with those of the thin film transistor as described in the above embodiments, which are not repeated here.

It is understood that the above general description and the following detailed description are merely illustrative and explanatory, and do not intend to limit the present disclosure in any manner.

BRIEF DESCRIPTION OF THE DRAWINGS

In order to explain the technical solutions in the embodiments of the present disclosure or the prior art more clearly, the drawings to be used in the description of the embodiments or the prior art will be introduced briefly in the following. Apparently, the drawings described below are only some embodiments of the present disclosure.

Figure 1A:
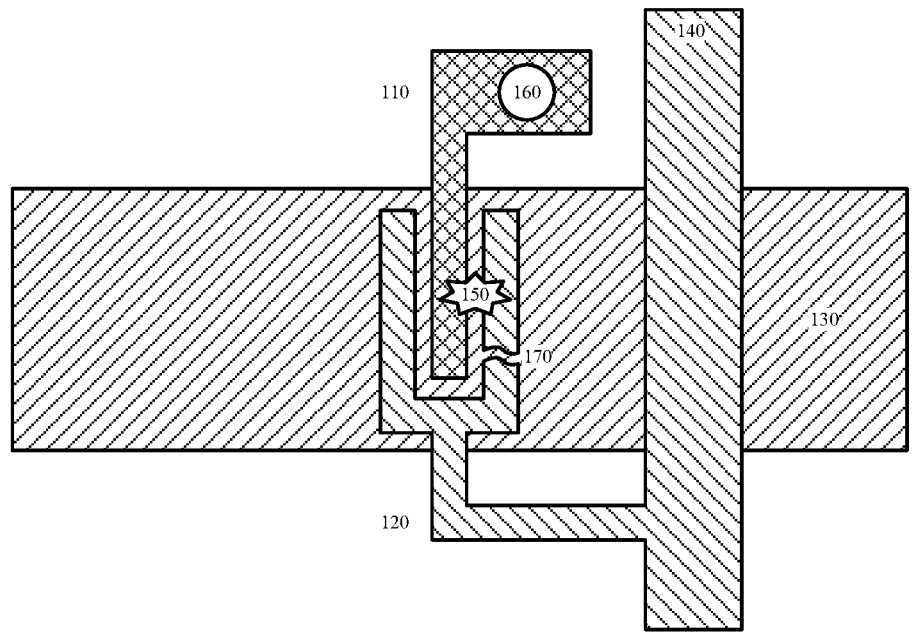
FIG. 1A is a top view for illustrating a thin film transistor.

These drawings and verbal description do not intend to limit the scope of the present inventive concept, but to convey the present inventive concept to the person with ordinary skill in the art with reference to specific embodiments.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

REFERENCE NUMERALS 110, 310, 410, 510, 610, 710 first electrode;
200 display substrate;
202 display area;
204 peripheral area;
208 pixel;
311, 411, 511, 611, 711 first conducting part;
312, 412, 612 first connection part;
413, 613, 713 first electrode line;
120, 320, 420, 520, 620, 720 second electrode;
321, 421, 521, 621, 721 second conducting part;
322, 522 second connection part;
323, 423, 523, 623, 723 second electrode line
130, 330, 430, 530, 630, 730 third electrode;
332, 432, 532, 632, 732 opening part;
140, 340, 440, 540, 640, 740 data line;
150, 350, 450, 550, 650, 750 foreign materials or residuals;
160, 360, 460, 560, 660, 760 via; and
170, 370, 470, 570, 670, 770 cutting area.

The same reference numerals or reference numerals differing by a multiple of 100 refer to same or similar component.

FIG. 1A shows a thin film transistor of a single channel type. The thin film transistor comprises a first electrode 110, a second electrode 120, and a third electrode 130. For example, the first electrode 110, the second electrode 120 and the third electrode 130 are a drain electrode, a source electrode and a gate electrode of the thin film transistor, respectively. In a liquid crystal display device, the gate electrode 130 is generally formed by a gate line, the source electrode 120 is connected to a data line 140, and the drain electrode 110 is connected to a pixel electrode (not shown) through a via 160. When the gate electrode 130 is loaded with a positive voltage, an electric field is formed between the gate electrode 130 and the drain electrode 110. The electric field forms an electrically conductive channel in a semiconductor layer (not shown) between the gate electrode 130 and the drain electrode 110. The electrically conductive channel electrically connects the source electrode 120 and the drain electrode 110 which are arranged in a same layer. When the gate electrode 130 is loaded with a negative voltage, the source electrode 120 and the drain electrode 110 are disconnected by the semiconductor layer.

During fabricating the thin film transistor, for example, foreign materials or residuals 150 possibly fall onto the drain electrode 110, the source electrode 120 or the gate electrode 130, so that some electrodes are subject to short circuit which leads to channel defect. When the thin film transistor is subject to channel defect due to short circuit, laser or the like is generally used for repair.

Currently, foreign materials or residuals are primarily detected by a final array test. As shown in FIG. 1A, when it is detected that foreign materials or residuals 150 cause short circuit between certain branches of the drain electrode 110 and the source electrode 120 in the thin film transistor, a laser is used to repair the source electrode 120 by cutting in a cutting area 170. Since the channel completely covers the gate line 130, the repair by cutting will inevitably damage the gate line 130, thus affect stability of the scan voltage which is applied to the gate line 130.

Figure 1B:
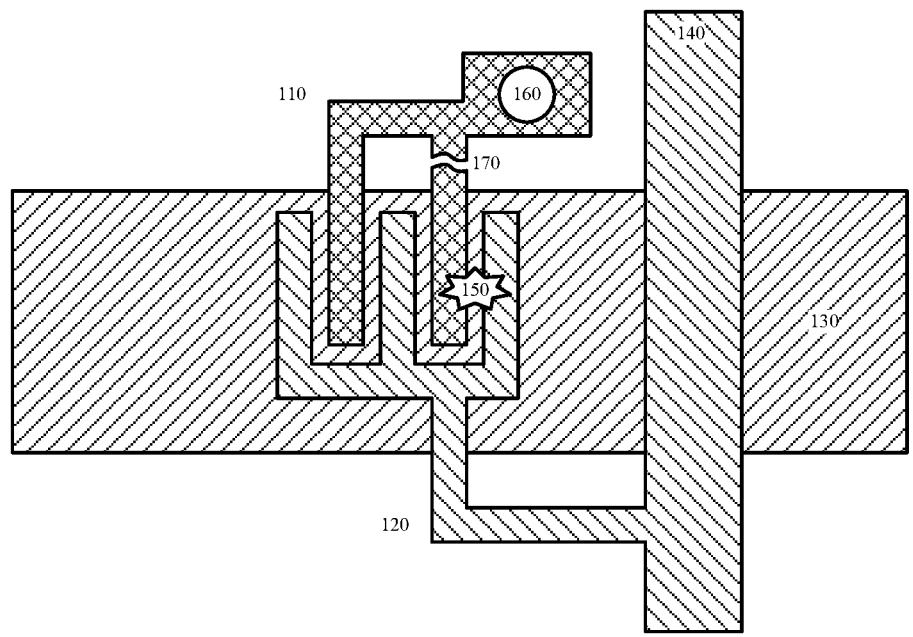
FIG. 1B is a top view for illustrating another thin film transistor.

FIG. 1B shows a thin film transistor of a dual-channel type. When it is detected that foreign materials or residuals 150 cause short circuit between a branch of the drain electrode 110 and a branch of the source electrode 120, a laser is used to repair the drain electrode 110 by cutting in the cutting area 170, and the switching effect of the channel is maintained. However, in the dual-channel design, the source electrode 120 occupies a large area in the pixel region, so that an ITO pattern which for example forms the pixel electrode in the display area occupies a small area, and this causes a low aperture ratio.

Embodiments of a thin film transistor, a GOA circuit, a display substrate, and a display device will be described hereinafter with reference to the drawings.

Figure 2:
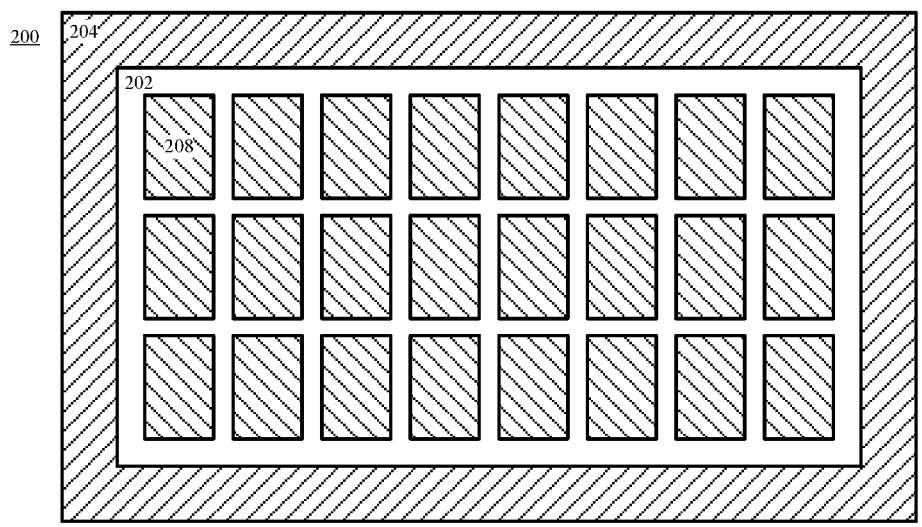
FIG. 2 is a top view for illustrating a display substrate in an embodiment of the present disclosure.

FIG. 2 schematically shows a display substrate in an embodiment of the present disclosure. In an exemplary embodiment, a display substrate 200 has a display area 202 and a peripheral area 204 outside the display area 202. The display area 202 is provided with a plurality of pixels 208. The peripheral area 204 is provided with lines or components such as a GOA circuit, connection pads, and wirings. As shown, the peripheral area 204 is an area surrounding the display area 202 in the display substrate 200. For example, the peripheral area 204 surrounds the display area 202, and a drive circuit or related lines and components are arranged in a partial region of the peripheral area 204. The display substrate 200 generally is an array substrate. In an exemplary embodiment, the display substrate 200 is a COA (color film on array) substrate. The display substrate 200 is assembled with a counter substrate like a color film substrate, to form a display panel of the display device. The display device for example is a liquid crystal display device, an OLED display device, a touch control display device, or a display device of other types.

An embodiment of the present disclosure provides a thin film transistor. The thin film transistor comprises a first electrode, a second electrode, and a third electrode. The first and second electrodes are arranged in a same layer and are insulated from each other. The third electrode is arranged below and insulated from the first and second electrodes. The first electrode comprises at least one first conducting part. The second electrode comprises a plurality of second conducting parts, each of which is arranged adjacent with each first conducting part. The third electrode is provided with an opening part which at least partially overlaps with the first or second conducting part. When the first or second conducting part is subject to a channel defect due to short circuit, the first or second conducting part is cut off at an overlapping position with the opening part, to repair the channel defect without affecting the third electrode.

Figure 3A:
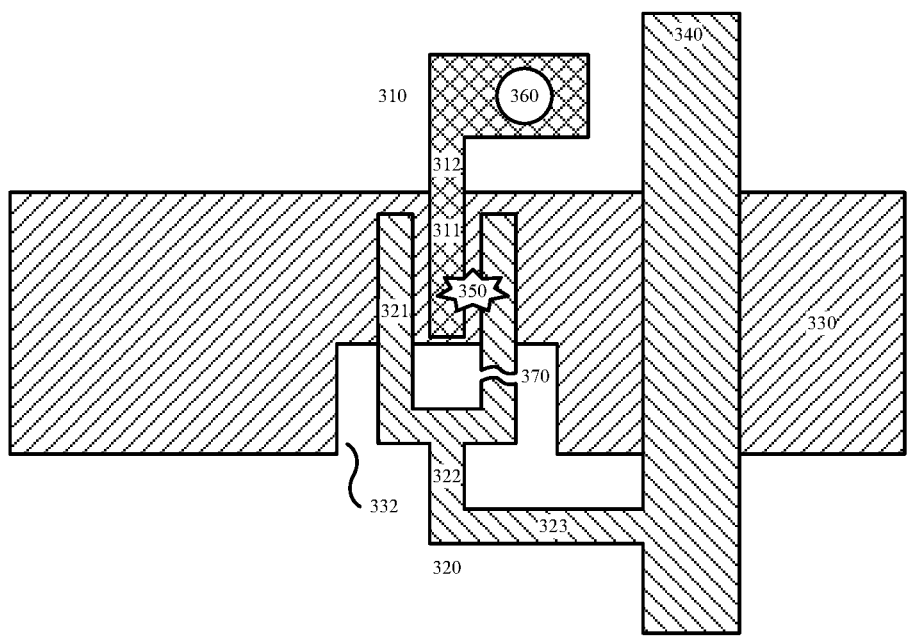
FIG. 3A is a top view for illustrating a thin film transistor in an embodiment of the present disclosure.

FIG. 3A schematically shows a thin film transistor in an embodiment of the present disclosure. The thin film transistor comprises a first electrode 310, a second electrode 320 and a third electrode 330. The first electrode 310 and the second electrode 320 are arranged in a same layer and are insulated from each other. The third electrode 330 is arranged below and insulated from the first electrode 310 and the second electrode 320. The first electrode 310 comprises one first conducting part 311, and the second electrode 320 comprises two second conducting parts 321. Each of the second conducting parts 321 is arranged adjacent with the first conducting part 311. The third electrode 330 is provided with an opening part 332, which at least partially overlaps with all of the second conducting parts 321.

When foreign materials or residuals 350 fall between the first conducting part 311 of the first electrode 310 and the second conducting parts 321 of the second electrode 320 and cause short circuit, the thin film transistor is subject to channel defect between the first conducting part 311 and the second conducting parts 321. In this case, at the overlapping region between the second conducting parts 321 and the opening part 332, i.e., a cutting area 370, one or more of the second conducting parts 321 is cut off by laser or the like, thereby repairing the channel defect. As shown, the cutting area 370 corresponds to the opening part 332 of the third electrode 330, i.e., the third electrode 330 is absent in this area. Therefore, the above repair does not affect the third electrode of thin film transistor 330, and does not affect the stability of scan voltage which is applied to the third electrode 330, i.e., the gate line.

In an exemplary embodiment, the first electrode 310, the second electrode 320 and the third electrode 330 are the drain electrode, the source electrode and the gate electrode of the thin film transistor, respectively. In a liquid crystal display substrate, the third electrode 330 generally is formed by the gate line, the second electrode 320 is connected to a data line 340, and the first electrode 310 is connected to a pixel electrode (not shown) through a via 360.

In an exemplary embodiment, as shown in FIG. 3A, the opening part 332 is arranged on an end region of the third electrode 330 along an extending direction of the first conducting part 311 or the second conducting parts 321. By arranging the opening part 332 on the end region of the third electrode 330, the overlapping region between the opening part 332 and the first conducting part 311 or the second conducting parts 321 is located at the end region of the third electrode 330, i.e., the cutting area 370 is located at the end region of the third electrode 330. In case the first conducting part 311 or the second conducting parts 321 is subject to a channel defect due to short circuit, the corresponding first conducting part 311 or second conducting parts 321 is cut off in the cutting area 370, and this can increase the success rate for repairing the channel defect. Moreover, by arranging the opening part 332 in the end region of the third electrode 330, the space utilization efficiency of the third electrode 330 is improved, and the width to length ratio of channel is increased. Increasing the width to length ratio of channel facilitates maintaining good channel performance of the thin film transistor after repairing the channel defect, and thus maintaining good electrical property. In case the thin film transistor has an increased width to length ratio of channel, the requirements in a size display device for a fast charging rate and high aperture ratio can be met.

In an exemplary embodiment, the opening part 332 has a strip shape, and the extending direction of the opening part 332 is perpendicular with that of the first conducting part 311 or the second conducting parts 321. The opening part 332 overlaps with all first conducting parts 311 or second conducting parts 321, thus providing the cutting area 370 for repair by cutting in case of channel defect.

In an exemplary embodiment, the opening part 332 has a regular shape, such as a rectangular or elliptic shape. In other embodiments, the opening part 332 has other elongated shapes, for example a rounded-corner rectangle. The opening part 332 has a length which is defined as a size in its extending direction. The length is generally enough to span all first conducting parts 311 or all second conducting parts 321. The opening part 332 has a width which is defined as a size in a direction perpendicular with its extending direction. The width is only required to provide suitable space for laser or other cutting off manner. In principle, the width of opening part 332 is as small as possible. This facilitates a relatively large width to length ratio for the channel.

In an exemplary embodiment, the thin film transistor further comprises a semiconductor layer (not shown). The semiconductor layer is arranged between the first and second electrode 310, 320 and the third electrode 330. An orthographic projection of the semiconductor layer coincides with an orthographic projection of the third electrode 330. In this way, the semiconductor layer is also absent at the opening part 332 of the third electrode 330. Thus the repair by cutting would not damage the semiconductor layer of the thin film transistor. This facilitates improving yield and reducing cost.

In an exemplary embodiment, as shown in FIG. 3A, the first electrode 310 further comprises a first connection part 312. The first conducting part 311 is electrically connected to connection pads through the first connection part 312, and further electrically connected to the pixel electrode through the via 360. The second electrode 320 further comprises a second connection part 322 and a second electrode line 323. The second electrode line 323 electrically connects the second conducting part 321 through the second connection part 322. The second electrode line 323 is electrically connected to the data line 340. The second electrode line 323 is generally arranged parallel with and close to the gate line, and thus occupies a small area of the pixel region.

In the above embodiments, the first conducting part 311 and the second conducting parts 321 refers to portions of the first electrode 310 and the second electrode 320 which forms a channel during operation of the thin film transistor. The second conducting parts 321, the second connection part 322, and the second electrode line 323 only refers to portions of the second electrode 320 which are different in term of structure or function.

It is noted that the opening part is defined as a portion of the third electrode where the electrode material is absent. The opening part can completely fall within the third electrode, i.e., the opening part is closed. Alternatively, the opening part can overlap with an edge of the third electrode, i.e., the opening part is open, as shown in FIG. 3A and the subsequent figures.

Figure 3B:
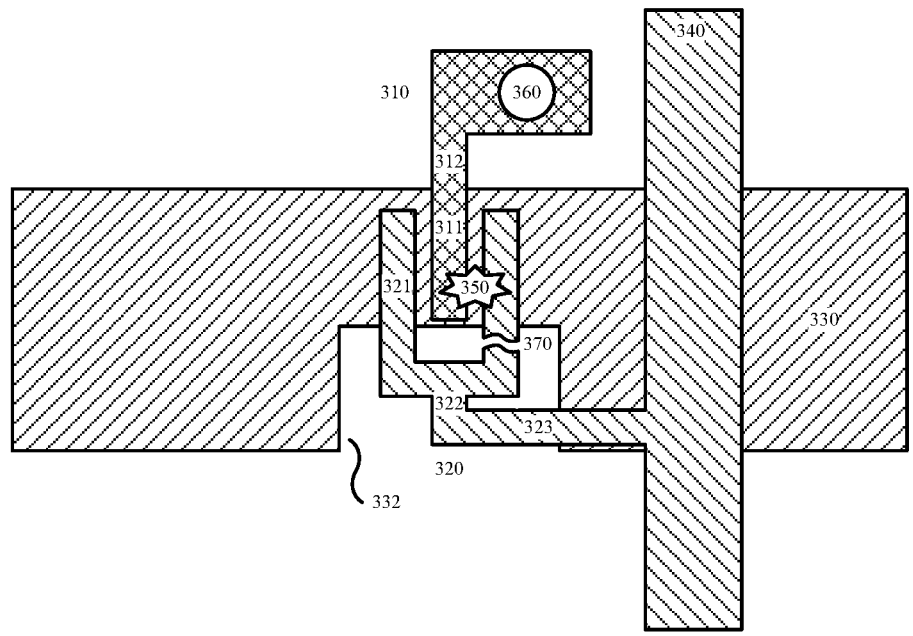
FIG. 3B is a top view for illustrating a variant of the thin film transistor shown in FIG. 3A.
Figure 3C:
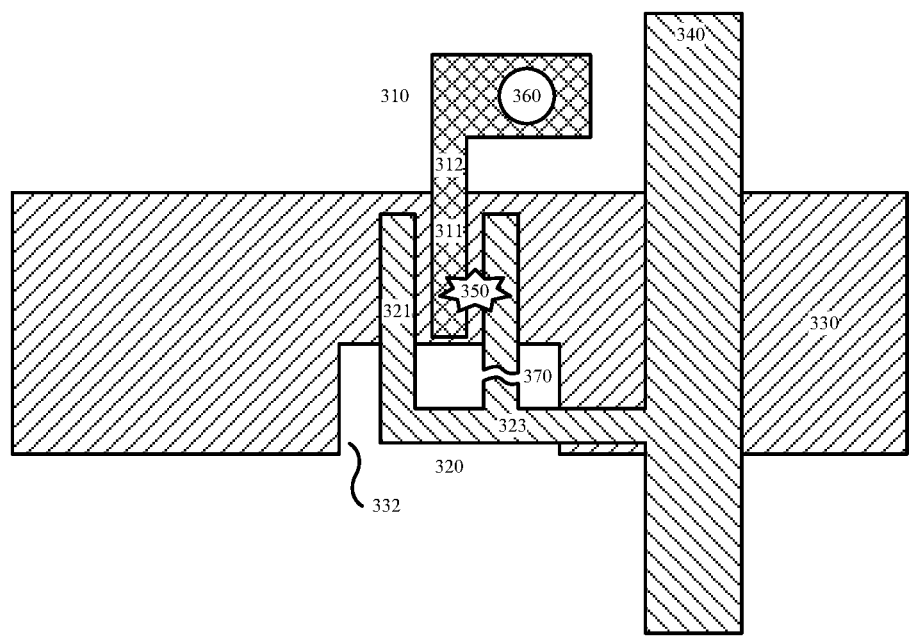
FIG. 3C is a top view for illustrating another variant of the thin film transistor shown in FIG. 3A.

FIG. 3B and FIG. 3C schematically show variants of the thin film transistor shown in FIG. 3A.

As shown in FIG. 3B, an orthographic projection of the second connection part 322 and the second electrode line 323 falls within an orthographic projection of the third electrode. In this way, the second connection part 322 and the second electrode line 323 do not occupy the pixel region, so that the ITO pattern occupies a larger portion of the pixel region, and the aperture ratio increases.

As shown in FIG. 3C, the second electrode 320 comprises the second conducting parts 321 and the second electrode line 323, and does not comprise the second connection part 322. An orthographic projection of the second electrode line 323 falls within an orthographic projection of the third electrode 330. In this way, the second electrode line 323 does not occupy the pixel region, so that the ITO pattern occupies a larger portion of the pixel region, and the aperture ratio increases. Moreover, since the second electrode 320 does not comprise the second connection part 322, the opening part 332 of the third electrode 330 can be relatively small and the space utilization efficiency of the third electrode 330 is increased. This facilitates increasing the width to length ratio of channel.

Figure 4A:
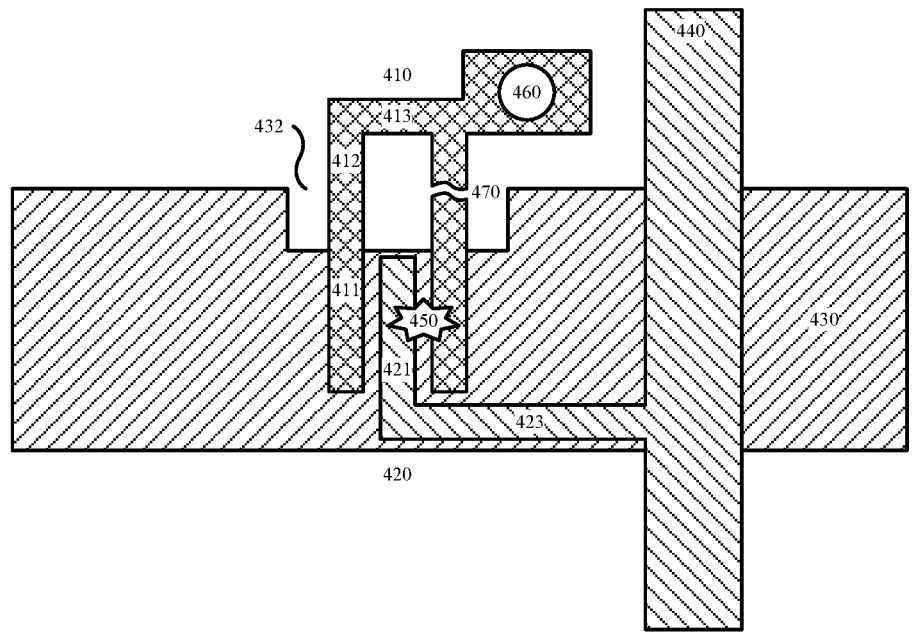
FIG. 4A is a top view for illustrating a thin film transistor in an embodiment of the present disclosure.

FIG. 4A schematically shows a thin film transistor in an embodiment of the present disclosure. As shown, a first electrode 410 comprises two first conducting parts 411, and a second electrode 420 comprises one second conducting part 421, thus forming a single channel design. A third electrode 430 is provided with an opening part 432, which at least partially overlaps with all first conducting parts 411.

When foreign materials or residuals 450 fall between the first conducting parts 411 and the second conducting part 421 and cause short circuit, at the overlapping region between the first conducting parts 411 and the opening part 432, i.e., a cutting area 470, one or more of the first conducting parts 411 is cut off by laser or the like, thereby repairing the channel defect. As shown, the cutting area 470 corresponds to the opening part 432 of the third electrode 430. Namely, the third electrode 430 is absent at the opening part 432. Therefore, the above repair does not affect the third electrode of thin film transistor 430, and does not affect the stability of scan voltage which is applied to the third electrode 430, i.e., the gate line.

As shown in FIG. 4A, the second conducting part 421 is connected to a data line 440 through a second electrode line 423. Similar with the second electrode 320 of FIG. 3A, the first electrode 410 comprises first connection parts 412 and a first electrode line 413. The first electrode line 413 electrically connects the first conducting parts 411 through the first connection parts 412. The first electrode line 413 is electrically connected to connection pads, and further electrically connected to a pixel electrode through a via 460. The first electrode line 413 is generally parallel with the gate line.

Figure 4B:
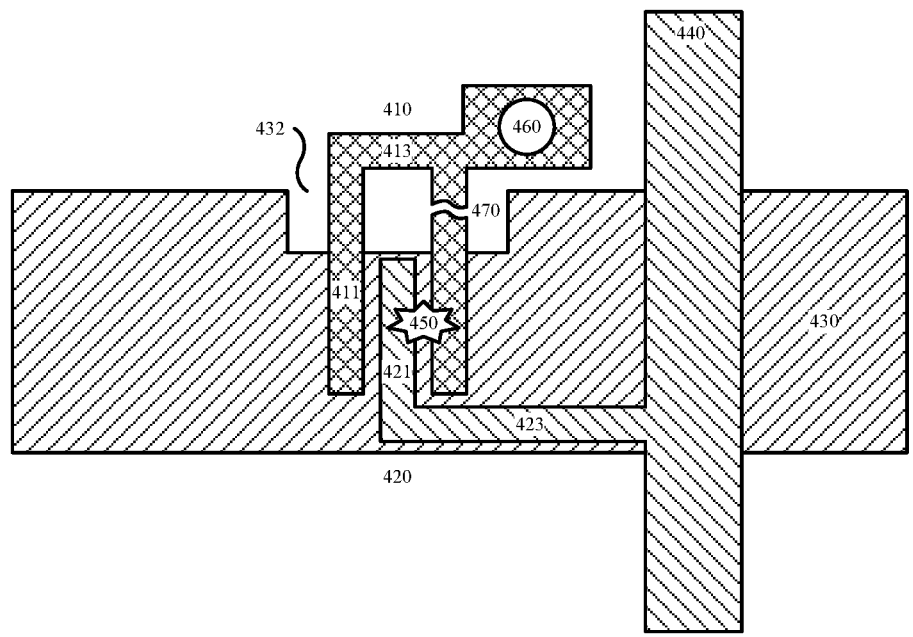
FIG. 4B is a top view for illustrating a variant of the thin film transistor shown in FIG. 4A.

FIG. 4B schematically shows a variant of the thin film transistor shown in FIG. 4A. As shown, in the first electrode 410, the first electrode line 413 directly electrically connects each of the first conducting parts 411 to connection pads, and further to the pixel electrode through the via 460. Since the first electrode 410 does not comprise the first connection parts 412, the opening part 432 of the third electrode 430 can be relatively small, and the space utilization efficiency of the third electrode 430 is improved. This facilitates increasing the width to length ratio of channel.

In the embodiment shown in FIG. 3A-3C, 4A-4B, the first conducting part 311, 411 and the second conducting parts 321, 421 have a linear shape. Thus, the first conducting part and second conducting parts have a simple and compact structure. This facilitates forming a channel with a relatively large width to length ratio in the limited area of the third electrode. In other embodiments of the present disclosure, the first conducting part and the second conducting part have a non-linear shape, as described hereinafter with reference to FIGS. 5A and 5B.

Figure 5A:
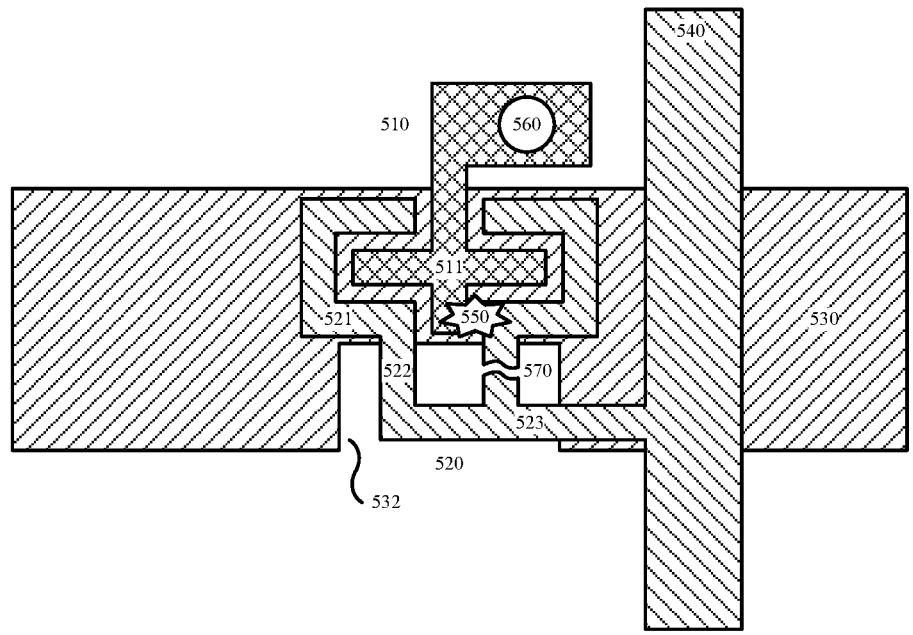
FIG. 5A is a top view for illustrating a thin film transistor in an embodiment of the present disclosure.

FIG. 5A schematically shows a thin film transistor in which the first conducting part and second conducting parts have a non-linear shape. In an exemplary embodiment, a first conducting part 511 has a cross-shape. Each of the second conducting parts 521 has a rectangular shape which is open at one end, and two second conducting parts 521 is arranged to surround the first conducting part 511.

Similar with the embodiment shown in FIG. 3B, a second electrode 520 further comprises a second connection part 522 and a second electrode line 523, and an orthographic projection of the second connection part 522 and the second electrode line 523 falls within an orthographic projection of a third electrode 530. When foreign materials or residuals 550 cause short circuit between the first conducting part 511 and second conducting part 521, at the overlapping region between the second conducting part 521 and an opening part 532, i.e., a cutting area 570, the corresponding second conducting part 521 is cut off, thereby repairing channel defect.

Figure 5B:
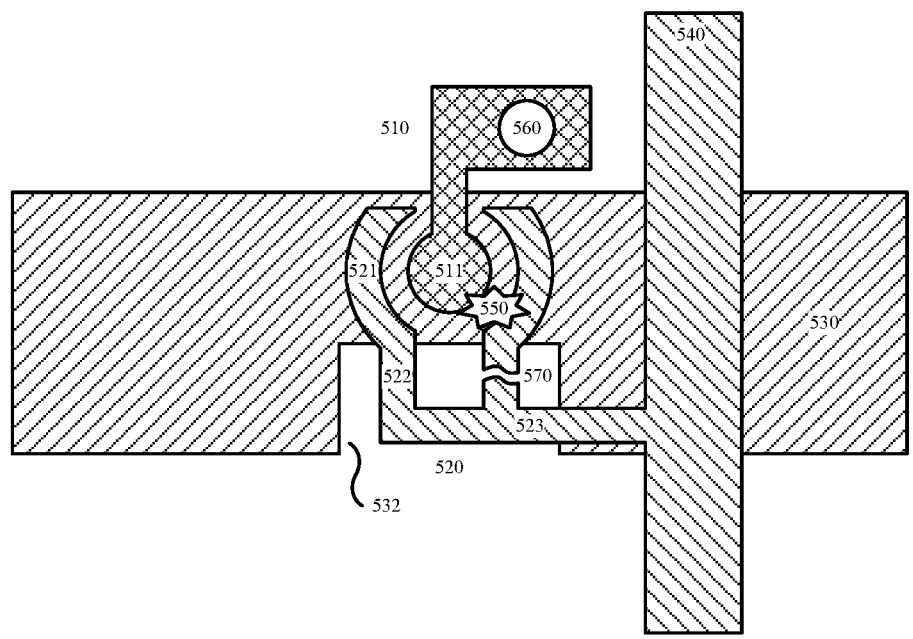
FIG. 5B is a top view for illustrating a variant of the thin film transistor shown in FIG. 5A.

FIG. 5B schematically shows a variant for the thin film transistor of FIG. 5A. As shown, in an exemplary embodiment, the first conducting part 511 comprises a circular portion. Each of the second conducting parts 521 has a circular shape, and two second conducting parts 521 are arranged to surround the first conducting part 511.

In the embodiment shown in FIGS. 5A and 5B, the first conducting part and the second conducting parts have a non-linear shape, and the second conducting parts are arranged to surround the first conducting part. This facilitates increasing the width to length ratio of channel in the thin film transistor.

In the embodiments shown in FIG. 3A-3C, 4A-4B, 5A-5B, the thin film transistor adopts a single channel design, but the present disclosure is not limited to this. In other embodiments of the present disclosure, the thin film transistor adopts two or more channel design. In particular, in an embodiment of the present disclosure, the first electrode comprises N first conducting parts, N being an integer larger than 1; the second electrode comprises at least N second conducting parts; and the first conducting part and second conducting parts are arranged alternately. In this case, thin film transistor has at least two channels, and this facilitates increasing the width to length ratio of channel. A simple dual-channel design with N=2 will be described hereinafter with reference to FIGS. 6A, 6B and 6C.

Figure 6A:
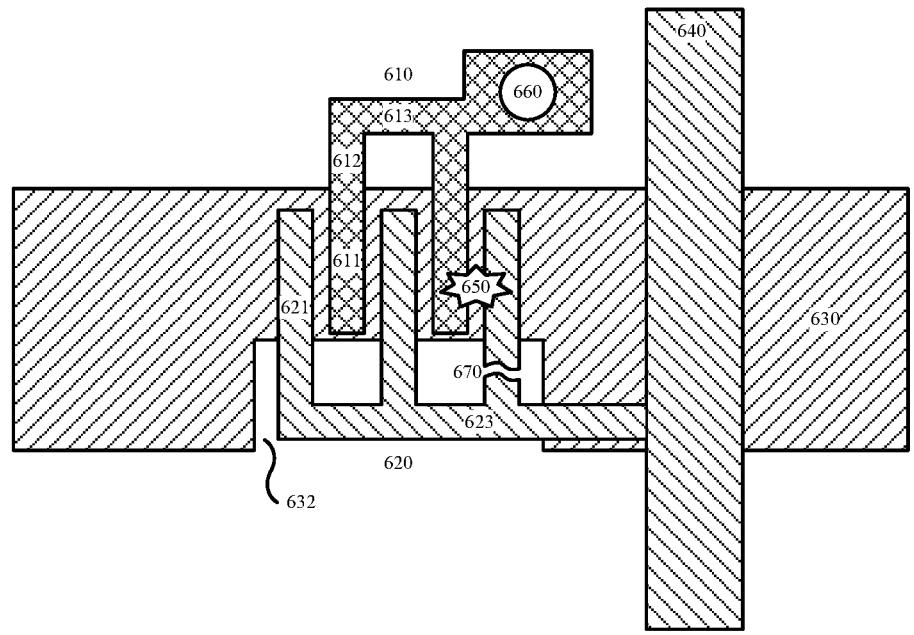
FIG. 6A is a top view for illustrating a thin film transistor in an embodiment of the present disclosure.

FIG. 6A schematically shows a thin film transistor in an embodiment of the present disclosure. As shown, a first electrode 610 comprises two first conducting parts 611, and a second electrode 620 comprises three second conducting parts 621. The first conducting parts 611 and the second conducting parts 621 are arranged alternately, and thus form two channels. A third electrode 630 is provided with an opening part 632, which at least partially overlaps all second conducting parts 621. When foreign materials or residuals 650 fall between the first conducting parts 611 and the second conducting parts 621 and cause short circuit, at an overlapping region between the second conducting parts 621 and the opening part 632, i.e., a cutting area 670, the corresponding second conducting parts 621 is cut off, thereby repairing channel defect.

As shown in FIG. 6A, the first electrode 610 comprises a first connection part 612 and a first electrode line 613. The first electrode line 613 electrically connects the first conducting parts 611 through the first connection part 612. The first electrode line 613 is electrically connected to connection pads, and further to the pixel electrode through a via 660.

In contrast with the embodiment shown in FIG. 1B, the opening part 632 of the third electrode 630 provides the cutting area 670 for repair by cutting, and an orthographic projection of the second electrode 620 falls within an orthographic projection of the third electrode 630. Therefore, in the thin film transistor, repair by cutting does not affect the third electrode 630. Moreover, the second electrode 620 does not occupy the pixel region, so that the display area has a high aperture ratio.

Figure 6B:
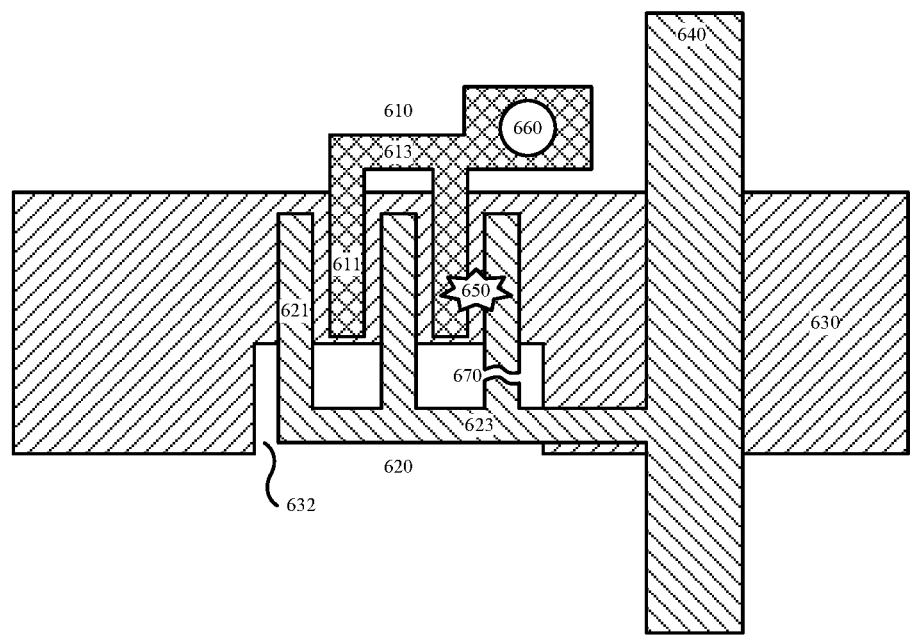
FIG. 6B is a top view for illustrating a variant of the thin film transistor shown in FIG. 6A.

FIG. 6B schematically shows a variant of the thin film transistor of FIG. 6A. As compared with FIG. 6A, the first electrode 610 does not comprise the first connection part 612. The opening part 632 of the third electrode 630 can be relatively small, and the space utilization efficiency of the third electrode 630 is improved. This facilitates increasing the width to length ratio of channel.

Figure 6C:
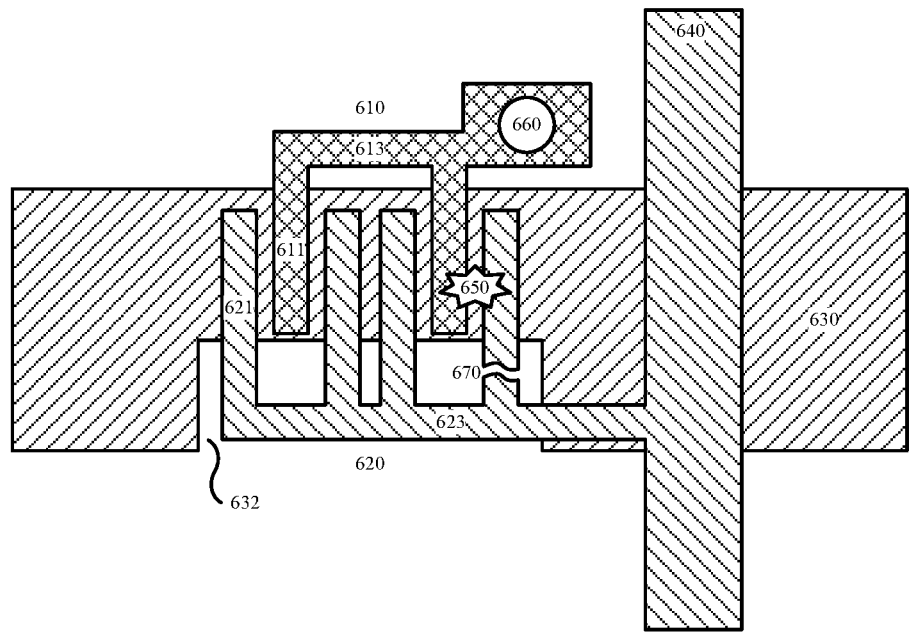
FIG. 6C is a top view for illustrating another variant of the thin film transistor shown in FIG. 6A.

FIG. 6C schematically shows another variant for the thin film transistor of FIG. 6A. As compared with FIG. 6A, the thin film transistor comprises two first conducting parts 611 and four second conducting parts 621, and each of the first conducting parts 611 is surrounded by two second conducting parts 621. Namely, two channels are independent from each other, and two neighboring channels do not share the second conducting parts 621. Therefore, when one of the channels is subject to defect and one of the second conducting parts 621 is cut off, the neighboring channel is not affected.

On basis of the dual-channel design of FIG. 6C, the thin film transistor can further adopt a design in which channels are independent from one another. In particular, the first electrode comprises N first conducting parts, N being an integer larger than 1; the second electrode comprises 2N second conducting parts; and each of the first conducting parts is surrounded by two second conducting parts.

Figure 7:
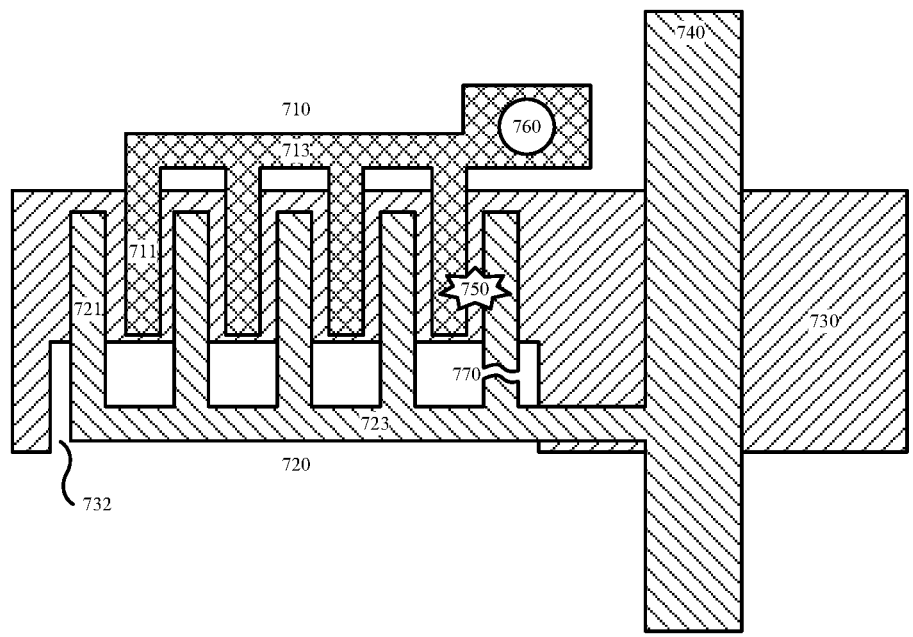
FIG. 7 is a top view for illustrating a thin film transistor in an embodiment of the present disclosure.

FIG. 7 schematically shows a thin film transistor in an embodiment of the present disclosure. As shown, a first electrode 710 comprises first conducting parts 711 and a first electrode line 713, and a second electrode 720 comprises second conducting parts 721 and a second electrode line 723. The first electrode line 713 and the first conducting parts 711 of the first electrode 710 have a comb shape, and the second electrode line 723 and the second conducting parts 721 of the second electrode 720 have a comb shape. The first conducting parts 711 and the second conducting parts 721 are arranged alternately, thus forming an interdigital electrode of a compact structure. The thin film transistor has two or more channels, and this facilitates increasing the width to length ratio of channel.

An embodiment of the present disclosure further provides a GOA circuit, comprising the thin film transistor as described above.

An embodiment of the present disclosure further provides a display substrate, comprising the thin film transistor as described above. As discussed, the first electrode is electrically connected to the pixel electrode of each pixel, the second electrode is connected to the data line, and the third electrode is the gate line.

The present disclosure embodiment further provides a display device, which comprises the display substrate as described above. The display device can be any product or component with a display function like a liquid crystal panel, electronic paper, a mobile phone, tablet computer, TV, monitor, notebook computer, digital photo frame, navigator, or the like.

Embodiments of the present disclosure disclose a thin film transistor, a GOA circuit, a display substrate, and a display device. The thin film transistor comprises a first electrode, a second electrode, and a third electrode. The first and second electrodes are arranged in a same layer and are insulated from each other. The third electrode is arranged below and insulated from the first and second electrodes. The first electrode comprises at least one first conducting part. The second electrode comprises a plurality of second conducting parts, each of which is arranged adjacent with each first conducting part. The third electrode is provided with an opening part which at least partially overlaps with the first or second conducting part. When the first or second conducting part is subject to a channel defect due to short circuit, the first or second conducting part is cut off at an overlapping position with the opening part, to repair the channel defect without affecting the third electrode.

In the above embodiments of the present disclosure, reference is made to a bottom-gate thin film transistor in which the gate electrode is arranged below the source electrode and the drain electrode. However, embodiments of the present disclosure do not intend to limit the structure of the thin film transistor. For example, the thin film transistor can be a top-gate type, in which the gate electrode is arranged above the source electrode and the drain electrode.

In the above embodiments of the present disclosure, reference is made to channel defect due to short circuit between the source electrode and the drain electrode which is caused by foreign materials or residuals. However, the present disclosure embodiment is also applicable to channel defect due to short circuit between the source electrode and the gate electrode, or between the drain electrode and the gate electrode, which is caused by foreign materials or residuals. Moreover, embodiments of the present disclosure are applicable to channel defect due to short circuit which is caused by ESD (Electro Static Discharge) or the like.

It is further noted that when embodiments of the present disclosure are described with reference to drawings, emphasis is placed on difference among drawings or embodiments, merely for the sake of simplifying the description.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A thin film transistor, comprising a first electrode, a second electrode, and a third electrode, wherein the first and second electrodes are arranged in a same layer and are insulated from each other, the third electrode is arranged below and insulated from the first and second electrodes,
   wherein the first electrode comprises one first conducting part;
   the second electrode comprises two second conducting parts, and each of the second conducting parts is arranged adjacent with the first conducting part; and
   the third electrode is provided with an opening part, and the opening part at least partially overlaps with each second conducting part of the second electrode,
   wherein the third electrode is a gate line, and the gate line forms a gate electrode of the thin film transistor at a portion where the gate line overlaps with the first electrode and the second electrode,
   wherein the opening part does not overlap with the first electrode,
   wherein the opening part is arranged at a side of the gate line away from the gate electrode and is flush with an edge of the gate line, and
   wherein in a direction perpendicular to an extending direction of the gate line, the gate line has a width, which is larger than a width of the gate electrode, and equals to a sum of the width of the gate electrode and a sum of the opening part.

2. The thin film transistor of claim 1, wherein
the opening part is arranged on an end region of the third electrode in an extending direction of the first conducting part or the second conducting parts.

3. The thin film transistor of claim 1, wherein
the opening part has a strip shape; and
the opening part extends in a direction perpendicular with the extending direction of the first conducting part or the second conducting parts.

4. The thin film transistor of claim 3, wherein
the opening part is rectangular or elliptic.

5. The thin film transistor of claim 1, wherein
the first conducting part and the second conducting parts have a linear shape.

6. The thin film transistor of claim 1, wherein
the first conducting part and the second conducting parts have a non-linear shape; and
the second conducting parts are arranged to surround the first conducting part.

7. The thin film transistor of claim 1, wherein
the second electrode further comprises a second electrode line for electrically connecting the second conducting parts.

8. The thin film transistor of claim 7, wherein
the second electrode further comprises a second connection part for electrically connecting the second conducting parts to the second electrode line; and
an orthographic projection of the second electrode line and the second connection part falls within an orthographic projection of the third electrode.

9. The thin film transistor of claim 7, wherein
an orthographic projection of the second electrode line falls within an orthographic projection of the third electrode.

10. The thin film transistor of claim 7, wherein
the first electrode further comprises a first electrode line for electrically connecting the first conducting part.

11. The thin film transistor of claim 10, wherein
the first and second electrodes have a comb shape.

12. The thin film transistor of claim 1, wherein
one of the first and second electrodes is a source electrode, and the other is a drain electrode.

13. A GOA (Gate On Array) circuit, comprising the thin film transistor of claim 1.

14. A display substrate, comprising the thin film transistor of claim 1, wherein the first electrode is electrically connected to a pixel electrode of each pixel, the second electrode is electrically connected to a data line.

15. A display device, comprising the display substrate of claim 14.

16. The thin film transistor of claim 1, wherein
the thin film transistor further comprises a semiconductor layer, which is arranged between the first and second electrodes and the third electrode; and
an orthographic projection of the semiconductor layer coincides with an orthographic projection of the third electrode.

* * * * *